US010927449B2

(12) United States Patent
Liu et al.

(10) Patent No.: US 10,927,449 B2
(45) Date of Patent: Feb. 23, 2021

(54) EXTENSION OF PVD CHAMBER WITH MULTIPLE REACTION GASES, HIGH BIAS POWER, AND HIGH POWER IMPULSE SOURCE FOR DEPOSITION, IMPLANTATION, AND TREATMENT

(71) Applicant: Applied Materials, Inc., Santa Clara, CA (US)

(72) Inventors: Jingjing Liu, Milpitas, CA (US); Ludovic Godet, Sunnyvale, CA (US); Srinivas D. Nemani, Sunnyvale, CA (US); Yongmei Chen, San Jose, CA (US); Anantha K. Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/857,384

(22) Filed: Dec. 28, 2017

(65) Prior Publication Data

US 2018/0209035 A1     Jul. 26, 2018

Related U.S. Application Data

(60) Provisional application No. 62/450,318, filed on Jan. 25, 2017.

(51) Int. Cl.
*C23C 14/34*     (2006.01)
*H01L 21/265*    (2006.01)
(Continued)

(52) U.S. Cl.
CPC ......... *C23C 14/3485* (2013.01); *C23C 14/35* (2013.01); *C23C 14/48* (2013.01);
(Continued)

(58) Field of Classification Search
CPC ...... C23C 14/3485; C23C 14/35; C23C 14/48
See application file for complete search history.

(56) References Cited

U.S. PATENT DOCUMENTS 5,242,539 A *  9/1993  Kumihashi ....... H01J 37/32082
                                              156/345.29
5,830,330 A   11/1998  Lantsman
(Continued)

FOREIGN PATENT DOCUMENTS

| WO | 2002015222 A2 | 2/2002 |
| WO | 2009001458 A1 | 12/2008 |
| WO | 2012036936 A2 | 3/2012 |

OTHER PUBLICATIONS

International Search Report and Written Opinion from PCT/US2017/069033 dated Aug. 14, 2018.
(Continued)

*Primary Examiner* — Errol V Fernandes
(74) *Attorney, Agent, or Firm* — Patterson + Sheridan, LLP

(57) ABSTRACT

Embodiments of the present disclosure provide a sputtering chamber with in-situ ion implantation capability. In one embodiment, the sputtering chamber comprises a target, an RF and a DC power supplies coupled to the target, a support body comprising a flat substrate receiving surface, a bias power source coupled to the support body, a pulse controller coupled to the bias power source, wherein the pulse controller applies a pulse control signal to the bias power source such that the bias power is delivered either in a regular pulsed mode having a pulse duration of about 100-200 microseconds and a pulse repetition frequency of about 1-200 Hz, or a high frequency pulsed mode having a pulse duration of about 100-300 microseconds and a pulse repetition frequency of about 200 Hz to about 20 KHz, and an
(Continued)

exhaust assembly having a concentric pumping port formed through a bottom of the processing chamber.

17 Claims, 6 Drawing Sheets

(51) Int. Cl.
    *H01J 37/34*         (2006.01)
    *C23C 14/50*        (2006.01)
    *C23C 14/35*        (2006.01)
    *C23C 14/48*        (2006.01)
    *H01J 37/32*         (2006.01)
    *H01L 21/223*      (2006.01)

(52) U.S. Cl.
    CPC ........ *C23C 14/50* (2013.01); *H01J 37/32412* (2013.01); *H01J 37/32706* (2013.01); *H01J 37/32862* (2013.01); *H01J 37/3405* (2013.01); *H01J 37/3467* (2013.01); *H01L 21/2236* (2013.01); *H01L 21/26513* (2013.01); *H01J 37/32834* (2013.01)

(56) References Cited

U.S. PATENT DOCUMENTS

| | | |
|---|---|---|
| 6,051,114 A | 4/2000 | Yao et al. |
| 6,117,279 A | 9/2000 | Smolanoff et al. |
| 6,344,419 B1 | 2/2002 | Forster et al. |
| 8,530,330 B2 | 9/2013 | Ahn et al. |
| 2002/0068464 A1 | 6/2002 | Forster et al. |
| 2004/0172826 A1* | 9/2004 | Memmen ............... B23P 6/007 29/889.1 |
| 2005/0136656 A1 | 6/2005 | Zeng et al. |
| 2010/0252417 A1 | 10/2010 | Allen et al. |
| 2012/0244290 A1* | 9/2012 | Mullin ................. C23C 14/541 427/457 |
| 2016/0372305 A1* | 12/2016 | Uemura ............. H01J 37/3288 |
| 2017/0029936 A1* | 2/2017 | Chistyakov ........... C23C 14/228 |

OTHER PUBLICATIONS

Office Action from Chinese Patent Application No. 201780084678.4 dated Oct. 16, 2020.

* cited by examiner

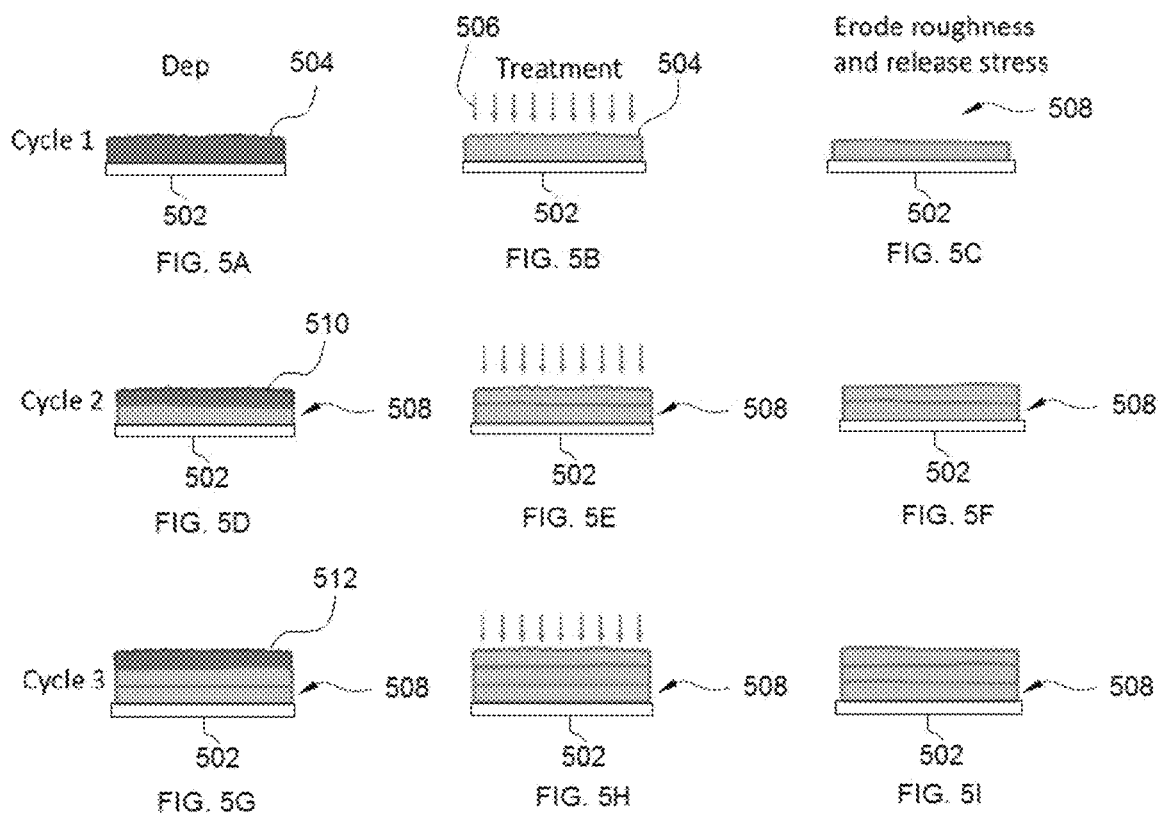
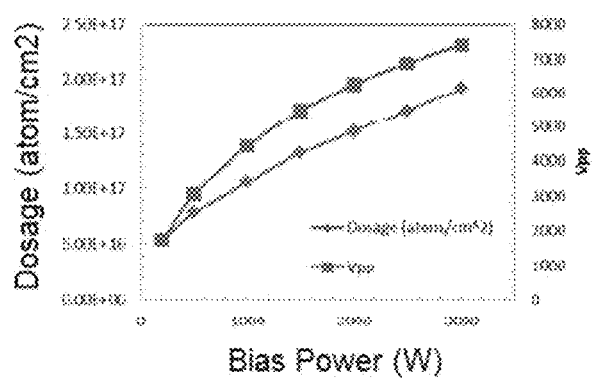
FIG. 6A
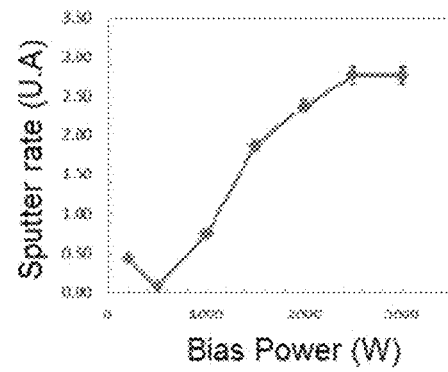
FIG. 6B

EXTENSION OF PVD CHAMBER WITH MULTIPLE REACTION GASES, HIGH BIAS POWER, AND HIGH POWER IMPULSE SOURCE FOR DEPOSITION, IMPLANTATION, AND TREATMENT

CROSS-REFERENCE TO RELATED PATENT APPLICATION

This application claims benefit of U.S. Provisional Patent Application Ser. No. 62/450,318, filed Jan. 25, 2017, which is hereby incorporated herein by reference.

FIELD

Embodiments of the present disclosure generally relate to apparatuses and methods of forming and ion implanting of metal and dielectric layers.

BACKGROUND

The fabrication of semiconductor devices involves, in part, the introduction of doping elements into the semiconductor substrate to form doped regions. The doping elements are selected to bond with the semiconductor material so as to create electrical carriers, thus altering the electrical conductivity of the semiconductor material. The electrical carriers can either be electrons (generated by N-type dopants) or holes (generated by P-type dopants). The concentration of dopant elements so introduced determines the electrical conductivity of the resultant region. Many such N-type and P-type doping regions are created to form transistor structures, isolation structures and other electronic structures, which function collectively as a semiconductor device. Some other applications may include implantation of metals to gate metal materials for surface function modification.

One method of introducing dopants into a semiconductor substrate is by ion implantation. Ion implantation is a process by which a desired dopant material is ionized in an ion source and the ions are accelerated in an electrical field to form an ion beam. The ion beam is directed at the substrate to implant ions into the substrate in a controllable doping profile by controlling the energy of the ion beam. The implantation dose that can be delivered to a substrate over any given period of time is largely a function of the current density and power of the ion beam. One problem encountered with ion implantation processes is the ion beam may become unwieldy and either thermal damage or erratic implantation profiles ensue when the implantation current rises above a certain threshold (e.g., about 75 milliamps). The limit on the ion beam power is undesirable since certain dopant materials, such as rare earth metals, require higher ion beam power to ionize due to their high melting point.

Therefore, there exists a need for an improved plasma doping system for ion implantation of various types of materials.

SUMMARY

Embodiments of the present disclosure generally provide an improved sputtering chamber with in-situ ion implantation capability for various materials from metal to dielectric with high film quality. In one embodiment, the sputtering chamber comprises a target having a first surface disposed in a processing region of the processing chamber and a second surface that is opposite the first surface, an RF and a DC power supply coupled to the target, a support body comprising a flat substrate receiving surface across the entire diameter of the substrate support, a bias power source coupled to the support body, a pulse controller coupled to the bias power source, wherein the pulse controller applies a pulse control signal to the bias power source such that the bias power is delivered either in a regular pulsed mode having a pulse duration of about 100 microseconds to about 200 microseconds and a pulse repetition frequency of about 1 Hz to about 200 Hz, or a high frequency pulsed mode having a pulse duration of about 100 microseconds to about 300 microseconds and a pulse repetition frequency of about 200 Hz to about 20 KHz, and an exhaust assembly having a concentric pumping port formed through a bottom of the processing chamber.

In another embodiment, the sputtering chamber comprises a sputtering target, a rotating magnetron disposed adjacent to a surface of the sputtering target, an RF power supply coupled to the sputtering target, a DC power supply coupled to the sputtering target, a support body comprising a substrate receiving surface, wherein at least a portion immediately below the substrate receiving surface has a uniform thickness across the diameter of the substrate receiving surface, a bias power source coupled to the support body, a pulse controller coupled to the bias power source, the pulse controller applying a pulse control signal to the bias power source such that the bias power is delivered either in a regular pulsed mode having a pulse duration of about 100 microseconds to about 200 microseconds and a pulse repetition frequency of about 1 Hz to about 200 Hz, or a high frequency pulsed mode having a pulse duration of about 100 microseconds to about 300 microseconds and a pulse repetition frequency of about 200 Hz to about 20 KHz, a gas conduit disposed at a sidewall of the processing chamber, a shield coupled to the sidewall of the processing chamber, wherein the shield extends downwardly to at least partially confine a portion of a processing region, and an exhaust assembly having a pumping port formed through a bottom of the processing chamber, wherein the pumping port is disposed symmetrically about a central axis passing through the center of the processing chamber.

In yet another embodiment, a method for processing a substrate is provided. The method comprises providing a substrate on a substrate support disposed in a processing region of a processing chamber, wherein the processing chamber has an RF power supply and a DC power supply coupled to a target disposed in the processing chamber, pumping the processing region to mTorr range, providing an RF power to the target to form a plasma in the processing region, providing a DC power to the target to form a film layer on a surface of the substrate, and after a predetermined thickness of the film layer is formed, turning off the RF power supply and the DC power supply, and providing a bias power of about 1 kW to about 30 kW to the substrate support for a short period of time to implant ions remaining in the processing region into the surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 5A-5I are schematic cross-section views of a carbon-based film formed using the process flow diagram of FIG. 4.

FIG. 6A is a graph of DC voltage and dosage as a function of the bias power according to embodiments of the present disclosure.

FIG. 6B is a graph of sputter rate as a function of bias power according to embodiments of the present disclosure.

DETAILED DESCRIPTION

Figure 1:
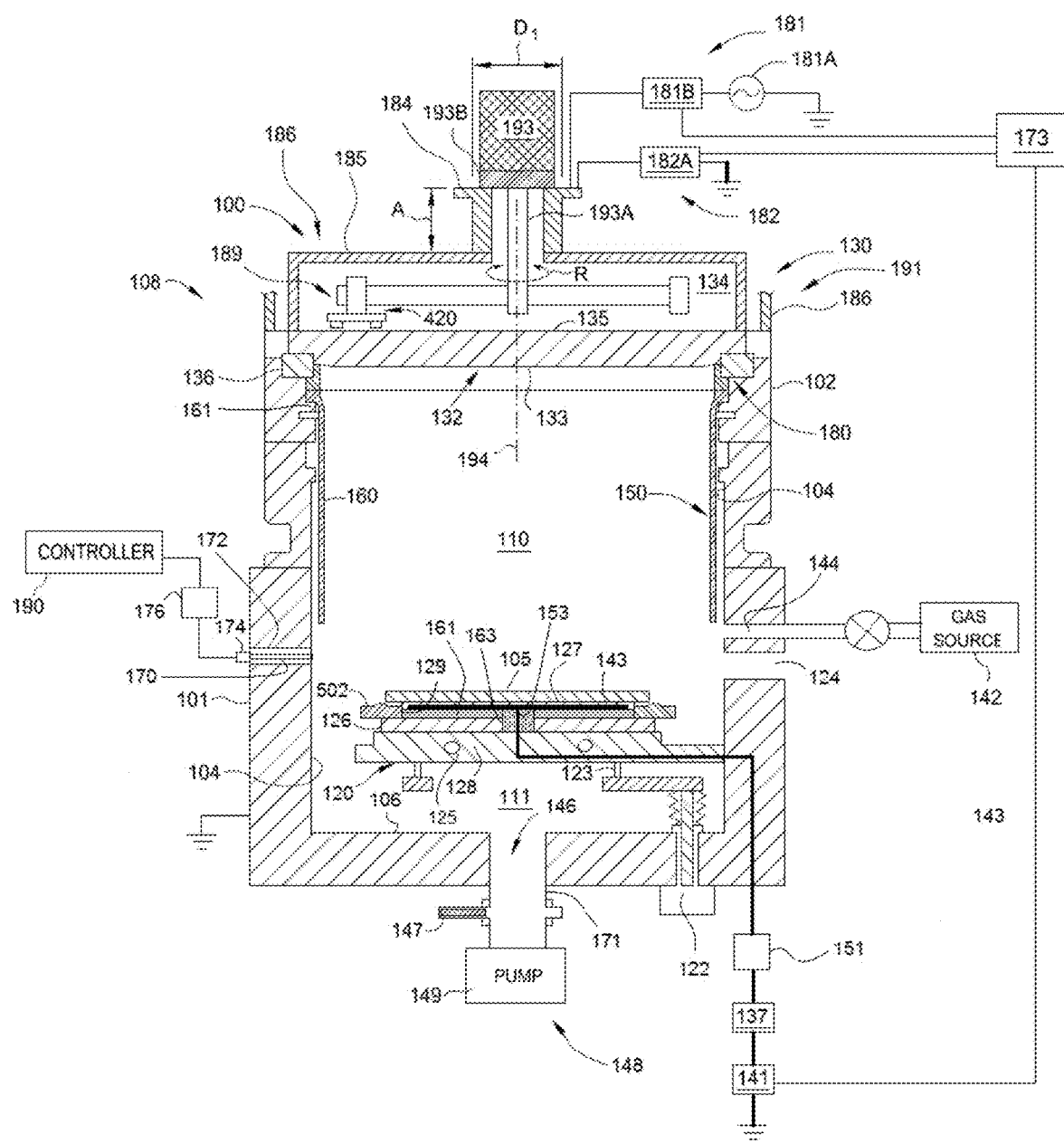
FIG. 1 illustrates an exemplary processing chamber according to embodiments of the present disclosure.

FIG. 1 illustrates an exemplary processing chamber 100 according to embodiments of the present disclosure. The processing chamber 100 generally includes an upper process assembly 108, a process kit 150 and a pedestal assembly 120, which are all configured to process a substrate 105 disposed in a processing region 110. In the embodiment shown, the processing chamber 100 is a sputtering chamber, such as a physical vapor deposition (PVD) chamber, capable of depositing a single or multi-compositional material from a target 132 onto a substrate 105. While a PVD chamber is discussed and shown, it is contemplated that embodiments of the present disclosure are equally applicable to other process chambers, such as a plasma etch chamber, a plasma enhanced chemical vapor deposition chamber, a plasma treatment chamber, an ion implantation chamber, or other suitable vacuum processing chamber. It is contemplated that other processing chambers including those from other manufacturers may be adapted to benefit from one or more of the embodiments of the disclosure described herein.

The processing chamber 100 includes a chamber body 101 having sidewalls 104, a bottom wall 106, and an upper process assembly 108 that enclose a processing region 110 or plasma zone. The chamber body 101 is typically fabricated from welded plates of stainless steel or a unitary block of aluminum, either anodized or non-anodized. In one embodiment, the sidewalls comprise aluminum and the bottom wall comprises a stainless steel plate. The sidewalls 104 contains a slit valve 124 to provide for entry and egress of a substrate 105 to and from the processing chamber 100.

The process kit 150 may comprise various components that can be easily removed from the chamber 100, for example, to clean sputtering deposits off the component surfaces, replace or repair eroded components, or to adapt the chamber 100 for other processes. In one embodiment, the process kit 150 comprises a shield 160 and an isolator ring assembly 180. The shield 160 is fastened to and supported by a ledge 161 of an adaptor 102. The adaptor 102 is coupled to the sidewalls 104, and is configured to help with the removal of the upper process assembly 108 and isolator ring assembly 180. The shield 160 extends downwardly and may have a generally tubular shape with a constant diameter. In one embodiment, the shield 160 is extended along the sidewalls 104 downwardly to a point adjacent to the gas conduits 144. In one embodiment, the shield 160 is electrically coupled to a ground. The shield 160 at least partially encloses a portion of the processing region 110 above the substrate receiving surface. Components in the upper process assembly 108 of the processing chamber 100 in cooperation with the shield 160 and the pedestal assembly 120 reduce particle generation and stray plasma outside the processing region 110. Particularly, the tubular shape of the shield 160 confines the plasma formed in the processing region 110 to the interior processing region above the substrate 105, thereby increasing the plasma interaction with the surface of the substrate 105 while reducing undesirable deposition of sputtered material onto the chamber components, such as the sidewalls 104.

Figure 2:
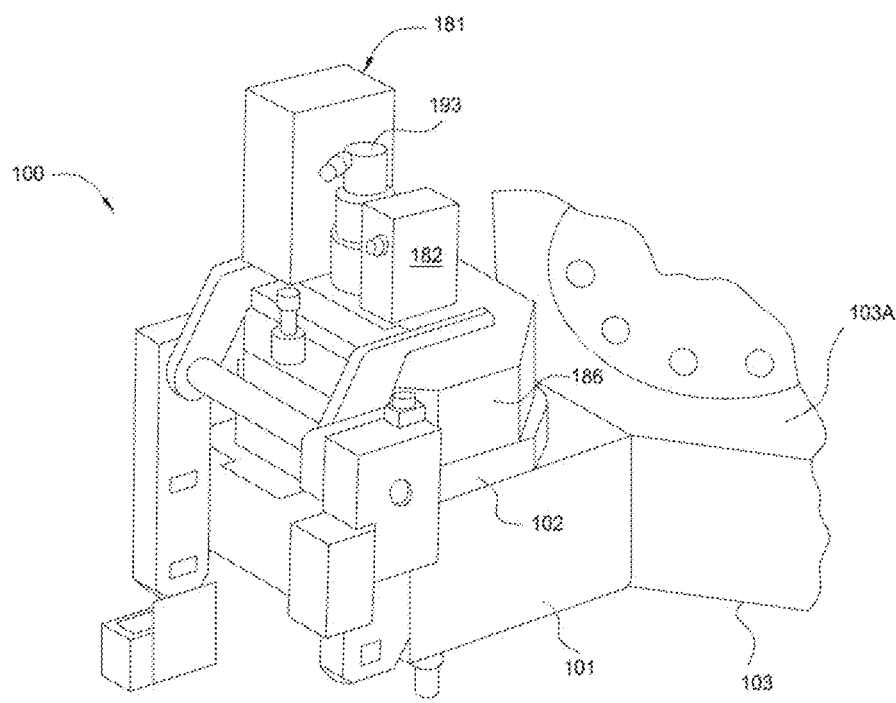
FIG. 2 is an isometric view of the processing chamber that is coupled to a processing position of a cluster tool.

FIG. 2 is an isometric view of the processing chamber 100 that is coupled to a processing position of a cluster tool 103. The cluster tool 103 may also contain other processing chambers (not shown) that are adapted to perform one or more processing steps on a substrate prior to or after performing the deposition process in the processing chamber 100. An exemplary cluster tool 103 may include a Centura™ or an Endura™ system available from Applied Materials, Santa Clara, Calif. The cluster tool 103 may include one or more load-lock chambers (not shown), one or more process chambers, and a cool-down chamber (not shown), all of which are attached to a central transfer chamber 103A. In one example, the cluster tool 103 may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes. A transfer tool, for example, a robot (not shown) disposed in the transfer chamber 103A, may be used to transfer substrates to and from one or more chambers attached to the cluster tool 103.

Pedestal Assembly

The pedestal assembly 120 generally includes a support 126 coupled to a platform 128. The platform 128 is typically fabricated from a metallic material such as stainless steel or aluminum. The support 126 may be comprised of aluminum or ceramic. A cooling channel 125 is disposed within the platform 128 to regulate the temperature of the support 126 by circulating a heat transfer medium from a medium source (not shown). Alternatively, a cooling plate may be used. In such a case, the cooling plate may be disposed against a bottom surface of the support 126. The cooling plate may be fabricated from a material having good thermal conductivity to promote uniform heat transfer between the cooling plate and the support 126. For example, the cooling plate may be fabricated from copper, stainless steel, tungsten, or molybdenum etc. The cooling plate should have a low linear thermal expansion coefficient or have a thermal expansion coefficient matching the platform 128 and/or the support 126. In one example, the cooling plate is fabricated of tungsten or molybdenum.

The pedestal assembly 120 may be supported from the bottom 106 or cantilever mounted on the sidewalls 104 of the chamber 100. In the embodiment shown, the pedestal assembly 120 is supported by the sidewalls 104 of the chamber 100 through the platform 128. A portion of the chamber wall, such as the sidewall 104, is grounded. Additionally or alternatively, the platform 128 may be grounded through the chamber wall. While the pedestal assembly 120 is shown as a fixed-type configuration to reduce circuit wiring complexities, it is contemplated that the pedestal assembly 120 may be configured to move vertically between different processing positions by lift pins 123 of a lift mechanism 122.

The support 126 has a substrate receiving surface 127 that receives and supports the substrate 105 during processing, the substrate receiving surface 127 being substantially parallel to a sputtering surface 133 of the target 132. The support 126 also has a peripheral edge 129 that may terminate before an overhanging edge of the substrate 105. The support 126 may be an electrostatic chuck, a ceramic body, a heater, a chiller, or any combination thereof. In one embodiment, the support 126 is a ceramic body having one or more electrodes (such as the bias electrode 143) disposed therein. In another embodiment, the support 126 is an electrostatic chuck that includes a dielectric body having one or more electrodes (such as the bias electrode 143) disposed therein. The dielectric body is typically fabricated from a high thermal conductivity dielectric material such as pyrolytic boron nitride, aluminum nitride, silicon nitride, alumina or an equivalent material.

The pedestal assembly 120 supports a deposition ring 502 along with the substrate 105. The deposition ring 502 is generally formed in an annular shape, or annular band, surrounding the support 126. The deposition ring 502 is configured to reduce formation of sputter deposits on the peripheral edges 129 of the support 126 during processing. In the embodiment shown, the deposition ring 502 may also include a bump or projection extending upwardly from the top surface of the deposition ring 502 to impede or prevent ingress of plasma species from contacting the backside of the substrate 105 around the peripheral edge. The deposition ring 502 may be fabricated from a material that can resist erosion by the sputtering plasma, for example, a metallic material such as stainless steel, titanium or aluminum, or a ceramic material, such as aluminum oxide. In one embodiment, the deposition ring 502 is formed from a stainless steel material.

A lift mechanism 122 is configured to move lift pins 123 to position a substrate a distance from the pedestal assembly 120 to facilitate the exchange of the substrate with a substrate transfer mechanism (not shown, disposed exterior to the processing chamber 100) passing through the slit valve 124.

In one embodiment, a bias power source 141 is provided and connected to a bias electrode 143 embedded in the support 126 through a matching network 137. The bias electrode 143 may be a single electrode plate extending across the diameter of the support 126 as shown. Alternatively, the bias electrode 143 may be comprised of discrete bias electrodes 143 in any desired arrangement, such as a concentric circular pattern, a spiral-like pattern, or a radial spoke pattern, etc. The bias power source 141 applies a high negative bias voltage to the support 126, and thus to the substrate 105 placed on the substrate receiving surface 127.

In various examples, the bias power source 141 may be configured to provide a bias power of about 0.1 kW to about 50 kW, such as between about 0.5 kW and about 30 kW, for example about 1 kW to about 25 kW. In one embodiment, the bias power source 141 is configured to provide a bias power of about 10 kW to about 16 kW, for example about 14 kW.

The bias electrode 143 may be directly or indirectly supported within the support 126 by at least an electrical bias insulator 161 and/or an inner seal ring 163 disposed in the support 126. The electrical bias insulator 161 and the inner seal ring 163 may include dielectric materials such as quartz, and other insulators. The inner seal ring 163 may extend through the electrical bias insulator 161 to allow wiring of the bias power source 141 to the bias electrode 143 as shown. The electrical bias insulator 161 and the inner seal ring 163 may be sized to provide a low capacitance between the support 126 and the bias electrode 143. In some embodiments, the electrical bias insulator 161 is sized to electrically isolate an upper portion of the support 126 (e.g., a portion directly beneath or adjacent to the substrate receiving surface 127) from the pedestal assembly 120, thereby preventing arcing within the processing chamber 100 when a high bias voltage (e.g., 1 kW or greater) is supplied to the bias electrode 143. In the embodiment shown, the electrical bias insulator 161 is extended radially across the entire diameter of the support 126. The bias power source 141 may use a bipolar DC supply or an RF supply.

Unlike conventional pedestal designs, which provide gas conduits or grooves in the upper surface of the pedestal assembly 120 to facilitate heat transfer of a cooling gas (e.g., helium) between the substrate and the pedestal assembly in a low pressure or vacuum environment, the pedestal assembly 120 of the present disclosure uses a flat substrate receiving surface 127 without gas conduits or grooves. A common problem with conventional pedestal design is that it would easily cause arcing at the upper surface of the pedestal when the pedestal is subjected to high bias voltage (e.g., 400 W or above) and high density plasma immediately above the substrate. One reason for this arcing to occur is that the gas conduits or grooves in the smooth, upper surface of the pedestal form air gaps and introduces discontinuity in the pedestal surface that distorts the electric field in the vicinity of the discontinuity, making arcing more probable. The gas conduits or grooves also decrease the efficiency of heat transfer between the substrate and the pedestal by reducing the solid to solid contact area across the diameter of the substrate receiving surface.

To reduce arcing and improve heat transfer efficiency between the cooling channel 125 and the substrate 105, the support 126 of the pedestal assembly 120 of the present disclosure uses a ceramic body having a flat substrate receiving surface 127 across the entire diameter of the support 126. The "flat" substrate receiving surface as described herein can be defined as a completely level surface without any cavities, holes or grooves formed therein. In the embodiment shown, at least the portion of the support 126 immediately below the substrate receiving surface 127, or the portion of the support 126 to be in physical contact with the substrate 105, has a uniform thickness across the diameter of the substrate receiving surface 127. Having the support 126 fabricated from bulk ceramic prevents the support 126 from being easily destroyed by high bias voltage used during the process. Since the flat substrate receiving surface 127 eliminates the air gaps between the pedestal assembly and the substrate, as would otherwise be seen in the conventional pedestal design using gas conduits or grooves for backside cooling, arcing is greatly minimized or eliminated even when a high bias voltage is supplied to the bias electrode 143. The heat transfer efficiency is also improved since the substrate 105 is in full solid to solid contact with the substrate receiving surface 127. The pedestal assembly 120 therefore has the ability of handling much higher bias power (i.e., above 1 kW), which enables a sputtering chamber to perform in-situ ion implantation process that has never been possible in the past with a conventional PVD chamber.

A pulse controller 173 may connect to and apply pulse control signals to the bias power source 141. Alternatively, high negative bias voltage can be provided in a constant manner. The pulse controller 173 is programmable to produce the desired pulse mode and/or duty cycle for the bias power source 141. For example, the bias power source 141 may be operated in a regular pulsed mode or a high frequency pulsed mode. In the regular pulsed mode, the high negative bias voltage may have a pulse duration of about 100 microseconds to about 200 microseconds and a pulse repetition frequency of about 1 Hz to about 200 Hz, for example about 50 Hz to about 100 Hz. The high negative bias voltage may be provided at a duty cycle of 1% to 10%. In the high frequency pulsed mode, the high negative bias voltage may have a pulse duration of about 100 microseconds to about 300 microseconds and a pulse repetition frequency of about 200 Hz to about 20 KHz, for example about 300 Hz to about 600 Hz. The high negative bias voltage may be provided at a duty cycle of 1% to 20%. The pulse duration or repetition frequency may be tuned to achieve designated film thickness and growth rate.

As will be discussed in more detail below, the bias power source 141 may be turned on at the end of each cycle of sputtering deposition for a short period of time for ion implantation of the deposited film, which releases film stress and smoothes film roughness. The bias power source 141 provides high negative bias voltage to the bias electrode 143 to attract the positive sputtered ions left from the sputtering deposition process. Particularly, high negative bias voltage increases the directionality of the sputtered ions toward the substrate 105 by producing an electrical potential gradient in the plasma sheath in front of the support 126, which in turn provides the force to accelerate the positively ionized sputtered dopant materials toward and onto the substrate surface. Since the bias voltage is high, the kinetic energy of the ions collided to the substrate will be greater. As a result, a greater doping profile is achieved.

In some embodiments, a probe 151 may be positioned on a feedpoint 153 between the matching network 137 and the embedded bias electrode 143 to simultaneously or nearly simultaneously measure and/or monitor implantation DC voltage, DC current (or RF voltage/current if an RF supply is used), and an instantaneous dosage. The measured current is used to estimate ion dose rate and/or dose profile, which may be used to control dosage or determine an endpoint. The probe 151 may be a voltage/current probe. Alternatively, the probe 151 may be replaced by individual instruments, such as a voltage sensor and a current sensor.

In order to monitor plasma species for accurate dosing control, a mass distribution sensor, such as an optical emission spectrometer (OES) 170, may be provided in the processing chamber 100 to quantitatively measure optical emissions from excited species in the plasma generated inside the processing chamber 100. In one embodiment shown, the optical emission spectrometer 170 is disposed adjacent a quartz window 172 formed on the chamber body 101. The optical emission spectrometer 170 may comprise a lens 174 disposed next to the quartz window 172. The lens 174, connected to the spectrometer 176, may be configured to collimate radiation of the plasma or excited species pass through the quartz window 172. The spectrometer 176 then spectrally separates the radiation based on wavelength and generates detection signals for one or more spatially separated wavelengths. Excited species, such as ionized sputtered dopant materials, may decay back from the excited energy level to the lower energy level by emitting light. Since the transition is between distinct atomic energy levels, wavelength of the emitted light can be used to identify the excited species. In addition, intensity of the emitted lights can also reflect concentration or distribution of different species in a plasma. Therefore, the use of an optical emission spectrometer 170 can monitor plasma species for accurate dosing control by detecting a portion of these emissions. A data acquisition device in a controller 190 may be used to collect data representing separated wavelength, hence properties of the ion species in the plasma, at a periodic sampling rate. The collected data may be processed and analyzed for generating control singles to the bias power source 141 or any other controllable components of the processing chamber 100 to adjust the process parameters, such as the bias voltage on the substrate, to control the degree of bombardment on the substrate surface during processing.

Centered Exhaust Assembly

Vacuum is maintained in the processing region 110 by an exhaust assembly 148, which removes spent processing gases, contaminants and byproducts from the processing chamber 100 through the evacuation region 111. The exhaust assembly 148 includes a vacuum pump 149 disposed adjacent to the bottom of the processing chamber 100. The vacuum pump 149 is in fluid communication with the evacuation region 111 via an exhaust conduit 171. The exhaust conduit 171 connects to a pumping port 146 formed through the bottom of the processing chamber 100. A throttle valve 147 is provided in the exhaust conduit 171 to permit isolation of the vacuum pump 149 when not in use. The vacuum pump 149 may be any suitable pump such as a turbomolecular pump. The throttle valve 147 is used in conjunction with the vacuum pump 149 to allow accurate pressure control in mTorr range within the processing region 110 by symmetrically drawing exhaust gases from the processing region 110 to the evacuation region 111, and out of the processing chamber 100 through a pumping port 146.

In various embodiments, the pumping port 146 is disposed directly beneath the pedestal assembly 120. In one embodiment, the pumping port 146 may be substantially concentric with the processing chamber 100. For example, the pumping port 146 may be disposed symmetrically about a central axis 194 passing vertically through the center of the processing chamber 100. The symmetrical positioning of the pumping port 146 about the central axis 194 provides improved gas flow symmetry within the processing chamber 100 to allow more uniform gas flow over the substrate surface about the entire circumference thereof and radially downwardly and outwardly from the processing chamber 100. Thus, the centrally located pumping port promotes uniform plasma formation and allows greater control of the plasma species and gas flow in the processing region 110, as compared to the conventional plasma systems having the difficulty in providing uniform plasma density due to asymmetry of the pumping port in the chamber.

Lid Assembly

The upper process assembly 108 may comprise an RF source 181, a direct current (DC) source 182, an adaptor 102, a motor 193, and a lid assembly 130. The lid assembly 130 generally comprises a target 132, a magnetron system 189 and a lid enclosure 191. The upper process assembly 108 is supported by the sidewalls 104 when in a closed position, as shown in FIG. 1. A ceramic target isolator 136 is disposed between the isolator ring assembly 180, the target 132 and adaptor 102 of the lid assembly 130 to prevent vacuum leakage therebetween. As discussed above, the adaptor 102 is coupled to the sidewalls 104 and configured to help with the removal of the upper process assembly 108 and isolator ring assembly 180.

When in the processing position, the target 132 is disposed adjacent to the adaptor 102, and is exposed to the processing region 110 of the processing chamber 100. The target 132 contains material that is to be implanted or deposited on the substrate 105 during a sputtering or an ion implantation process. The isolator ring assembly 180 is disposed between the target 132 and the shield 160 and chamber body 101 to electrically isolate the target 132 from the shield 160 and chamber body 101.

During sputtering processing, the target 132 is biased relative to a grounded region of the processing chamber (e.g., chamber body 101 and adaptor 102) by a source power disposed in the RF source 181 and the direct current (DC) source 182 under high pressure. The combination of RF and DC power sources allows for a lower overall RF power to be used during processing versus a RF only source, which can help to decrease plasma related damage of the substrate and increase device yield. In addition, delivering RF power to a DC powered target may decrease the target voltage and provide a corresponding sheath surrounding and dominating the DC power induced sheath. While an RF-DC powered target has a thicker plasma sheath formed below the target, and an overall higher voltage drop between the target and the plasma, the conductivity of the plasma will be increased due to the increased ion concentration in the plasma, which will make the target voltage drop at low to moderate RF powers. Thus, an argon ion (Ar+) is accelerated even more with a thicker sheath, providing a higher sputtering ion energy. The thicker plasma sheath will also increase the scattering yield. The addition of RF power also increases the ionization of the plasma which helps improve the affects of substrate bias on the depositing ions, and thus help improve step coverage of the film.

In one embodiment, the RF source 181 comprises an RF power source 181A and an RF match 181B that are configured to efficiently deliver RF power to the target 132. In most examples, the RF power source 181A is capable of generating RF currents at a frequency of between about 1 MHz and about 128 MHz, such as about 2 MHz to about 13.56 MHz, at powers between about 0 and about 20 kWatts, such as about 2 kW to about 10 kW. In one example, the RF power source 181A is configured to provide RF current at a frequency of 13.56 MHz at a power of 5 kW. The DC power supply 182A in the DC source 182 is capable of delivering between about 0 and about 10 kWatts of DC power, for example about 4 kW. Regardless of whether a regular pulsed mode or a high frequency pulsed mode is adapted during process, the RF power source 181A may be configured to generate an RF power density of between about 0 and about 33 kWatts/m$^2$ at the target and the DC source 182 may be configured to deliver a power density of between about 0 and about 66 kWatts/m$^2$.

The pulse controller 173 may connect to and apply pulse control signals to each of the RF power source 181A and the DC source 182. Alternatively, the source power can be provided in a constant manner. The pulse controller 173 is programmable to produce the desired pulse mode and/or duty cycle relationship for the RF power source 181A and the DC source 182. Similarly, the RF power and the DC power may be operated in a regular pulsed mode or a high frequency pulsed mode. In the regular pulsed mode, the RF power and the DC power may have a pulse duration of about 300 microseconds to about 800 microseconds and a pulse repetition frequency of about 1 Hz to about 200 Hz, for example about 50 Hz to about 100 Hz. The RF power and the DC power may be provided at a duty cycle of 50% to 90%. In the high frequency pulsed mode, the RF power and the DC power may have a pulse duration of about 100 microseconds to about 300 microseconds and a pulse repetition frequency of about 200 Hz to about 20 KHz, for example about 300 Hz to about 600 Hz. The RF power and the DC power may be provided at a duty cycle of 1% to 10%. In either mode, the RF source 181 and the DC source 182 may be pulsed synchronously or asynchronously. The pulse duration or repetition frequency may be tuned to achieve designated film thickness and growth rate. High-pulse high-frequency power source helps to breakdown target chemical bonds and create plasma with large fraction of target material ion species.

During sputtering deposition process, a gas, such as argon, is supplied to the processing region 110 from a gas source 142 via gas conduits 144 (only one is shown) disposed at sidewalls 104 of the chamber body 101. The gas source 142 may comprise a non-reactive gas such as argon, krypton, helium or xenon, which is capable of energetically impinging upon and sputtering material from the target 132. The gas source 142 may also include any desired reactive gas, such as one or more of an oxygen-containing gas or a nitrogen-containing gas, which is capable of reacting with the sputtering material to form a layer on a substrate. Multiple gases sources and gas conduits may be provided to enable other doping species. A plasma is formed between the substrate 105 and the target 132 from the gas. Ions within the plasma are accelerated toward the target 132 and cause material to become dislodged from the target 132. The dislodged target material is then deposited on the substrate, or implanted into the substrate upon application of high bias power to the pedestal assembly 120.

Spent process gas and byproducts are exhausted from the chamber 100 through pumping port 146 that receives spent process gas and direct the spent process gas to an exhaust conduit 171 having an adjustable position throttle valve 147 to control the pressure in the processing region 110 in the processing chamber 100. The exhaust conduit 171 is connected to one or more vacuum pump 149. Typically, the pressure of the sputtering gas in the chamber 100 during processing is set to sub-atmospheric levels, such as a vacuum environment, for example, a pressure of about 0.6 mTorr to about 400 mTorr. In one embodiment, the processing pressure is set to about 5 mTorr to about 100 mTorr. While only one gas conduit 144 is shown, it is contemplated that multiple gas conduits may be disposed at the sidewalls 104 to enable flowing of other doping species through the side of the processing chamber, and allow doping species to diffuse at the chamber operating pressure.

The lid enclosure 191 generally comprises a conductive wall 185, a center feed 184 and a shielding 186. In one configuration as shown, the conductive wall 185, the center feed 184, the target 132 and a portion of the motor 193 enclose and form a back region 134. The back region 134 is a sealed region disposed on the back side of the target 132 and is generally filled with a flowing liquid during processing to remove the heat generated at the target 132 during processing. The shielding 186 may comprise one or more dielectric materials that are positioned to enclose and prevent the RF energy delivered to the target 132 from interfering with and affecting other processing chambers disposed in the cluster tool 103 (FIG. 2). In one embodiment, the conductive wall 185 and center feed 184 are configured to support the motor 193 and magnetron system 189, so that the motor 193 can rotate the magnetron system 189 during processing. The motor 193 may be electrically isolated from the RF or DC power delivered from the power supplies by use of a dielectric layer 193B.

Magnetron Assembly

To provide efficient sputtering, a magnetron system 189 is positioned in back of the target 132 in the upper process assembly 108 to create a magnetic field in the processing region 110 adjacent the sputtering surface 133 of the target 132. The magnetic field is created to trap electrons and ions to thereby increase the plasma density and to thereby also increase the sputtering rate. According to one embodiment of the present disclosure, the magnetron system 189 includes a source magnetron assembly 320 that comprises a rotation plate 313, an outer pole 321 and an inner pole 322. The rotation plate 313 allows the positioning of the magnetic field generating components in the source magnetron assembly 320 to be moved relative to the central axis 194 of the processing chamber 100.

Figure 3A:
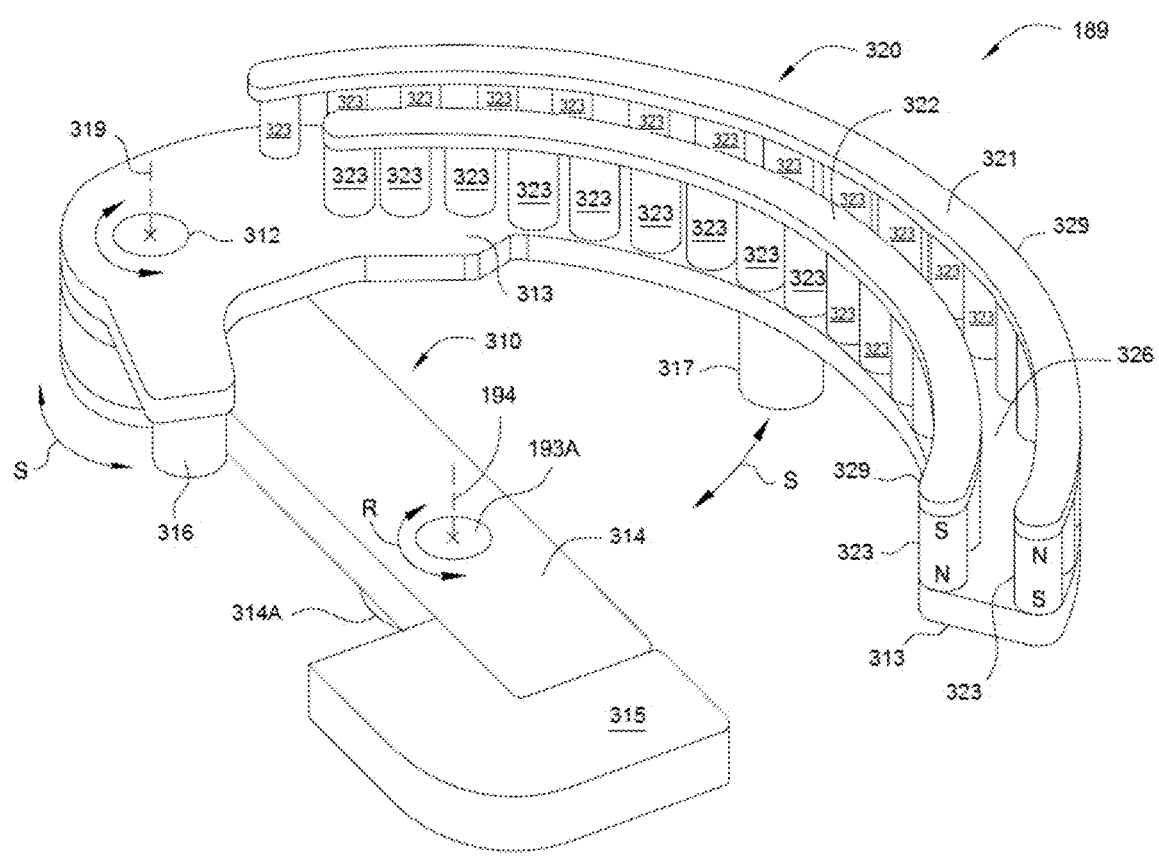
FIG. 3A is an isometric view of a magnetron viewed from the target side according to one embodiment of the disclosure.
Figure 3B:
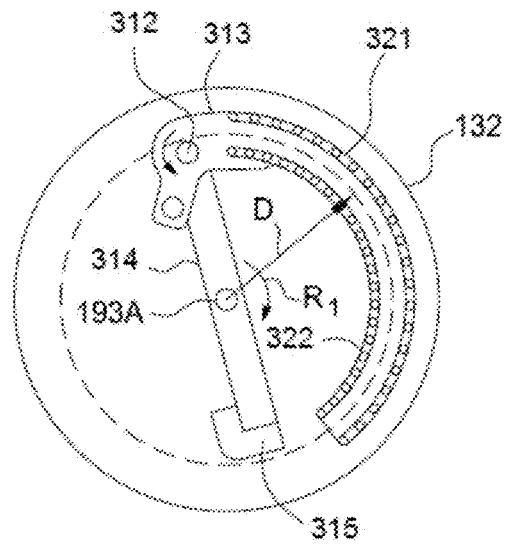
FIG. 3B is a bottom view of a portion of the magnetron according to one embodiment of the disclosure.
Figure 3C:
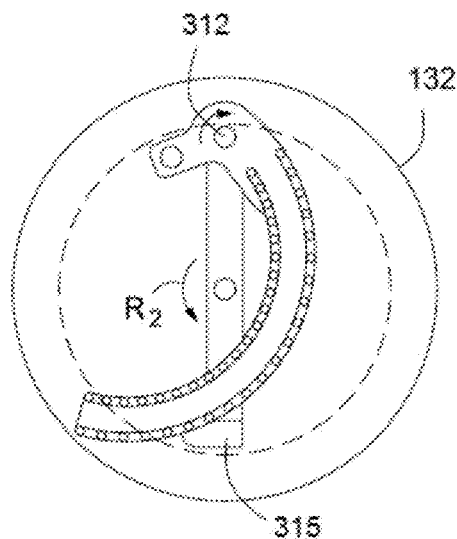
FIG. 3C is a bottom view of a portion of the magnetron according to one embodiment of the disclosure.
Figure 3D:
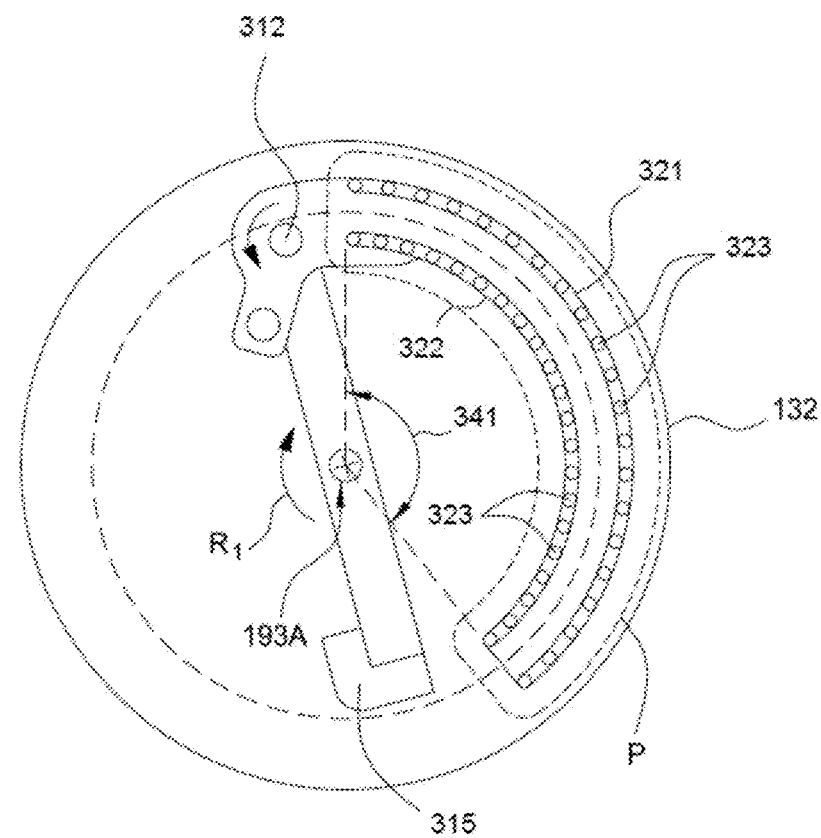
FIG. 3D is a bottom view of a portion of the magnetron according to one embodiment of the disclosure.

FIGS. 3A, 3B and 3D, illustrate a source magnetron assembly 320 that is positioned at a first radial position relative to the central axis 194, as viewed from the sputtering surface 133 side of the target 132. FIG. 3C illustrates the source magnetron assembly 320 when it is positioned at a second radial position relative to the central axis 194, which is different from the first radial position, and as discussed below is created by adjusting the rotation direction and speed. The rotation plate 313 is generally adapted to support and magnetically couple the outer pole 321 of a first magnetic polarity in the vertical direction and the inner pole 322 having a second magnetic polarity opposite to that of the first magnetic polarity. The inner pole 322 is separated from the outer pole 321 by a gap 326, and each of the poles generally comprises one or more magnets and a pole piece 329. The magnetic field extending between the two poles 321, 322 creates a plasma region "P" (FIG. 3D) adjacent a first portion of the sputtering face of the target 132. The plasma region "P" forms a high density plasma region that generally follows the shape of the gap 326.

In one embodiment, as shown in FIGS. 3A-3D, the magnetron system 189 is a non-closed loop design (e.g., open loop design) to reduce the intensity of the plasma formed in the plasma region "P" to compensate for the use of the improved ionization potential created by the delivery of the RF power, from the RF source 181, to the target 132. One will note that RF-powered plasmas are more effective in increasing the ionization of atoms (e.g., gas atoms and sputtered atoms) in the plasma than a DC-powered plasma, due to the more efficient coupling of the applied energy to the electrons in the plasma and other electron-plasma interaction phenomena that increase the energy of the electrons and enhance the ionization levels in the plasma.

In general, a "closed loop" magnetron configuration is formed such that the outer pole of the magnetron surrounds the inner pole of the magnetron forming a gap between the poles that is a continuous loop. In the closed loop configuration, the magnetic fields that emerge and reenter through a surface of the target form a "closed loop" pattern can be used to confine electrons near the surface of the target in a closed pattern, which is often called a "racetrack" type pattern. A closed loop, as opposed to the open-loop, magnetron configuration is able to confine electrons and generate a high density plasma near the sputtering surface 133 of the target 132 to increase the sputtering yield.

In an open loop magnetron configuration, the electrons trapped between the inner and outer poles will migrate, leak out and escape from the B-fields created at open ends of the magnetron, thus only holding the electrons for a short period of time during the sputtering process due to the reduced confinement of the electrons. However, surprisingly it has been found that the use of an open loop magnetron configuration, as described herein, provides improved material composition uniformity across the substrate surface, when used in conjunction with the RF and DC sputtering of target described herein.

In one embodiment of the magnetron system 189, a rotary shaft 193A powered by the motor 193 extends along a central axis 194 and supports a radial shifting mechanism 310, which comprises the rotation plate 313, counterweight 315 and the source magnetron assembly 320. Thereby, the radial shifting mechanism 310 moves the source magnetron assembly 320 in complementary radial directions, such as radially towards or away from the central axis 194 (i.e., reference numerals "S" in FIG. 3A) as the motor 193 is rotated in clockwise direction $R_1$ and counter-clockwise direction $R_2$ (FIGS. 3B, 3C).

FIG. 3A, which is an isometric view of one embodiment of the magnetron system 189, generally includes a cross arm 314 fixed at its center to the rotary shaft 193A by a clamp 314A. One end of the cross arm 314 supports a counterweight 315. The other end of the cross arm 314, which is across the rotation axis 194 from the counterweight 315, supports a pivot 312, or rotation bearing, that is used to rotatably support the source magnetron assembly 320 for rotation about an offset vertical pivot axis 319. In one configuration, the pivot axis 319 is substantially parallel to the rotation axis 194. In this configuration the magnetron 320 on the cross arm 314 allows it to swing in different and complementary radial directions with respect to the rotation center 194. The complementary motion arises due to the center of mass of the source magnetron assembly 320 being a distance from the pivot axis 319. Thus, as the cross arm 314 and source magnetron assembly 320 are rotated by the motor 193, the centripetal acceleration acting on the source magnetron assembly 320 cause it to pivot about pivot axis 319 in one direction or the other depending on the direction that the motor 193 is turning. The center of mass of the source magnetron assembly 320 may be defined as the center of gravity of the source magnetron assembly 320, which may be in-board of the inner pole 322, or closer to the rotation axis 194, for the configuration illustrated in FIGS. 3A-3D.

The switching between the two positions is effected by reversing the direction of rotation of the rotary shaft 193A about the rotation axis 194 and hence of the entire magnetron system 189 about the rotation axis 194. As illustrated in the top plan view of FIG. 3D, when the rotary shaft 193A rotates the cross arm 314 in the counter clockwise direction $R_1$ about the rotation axis 194, the inertia and impeding forces cause the source magnetron assembly 320 to rotate in the counter-clockwise direction about the pivot axis 319 until the bumper 316 fixed to the source magnetron assembly 320 engages one side of the cross arm 314. In this processing configuration, or magnetron processing position, the source magnetron assembly 320 is disposed at its radially outward position close to the edge of the target 132, so that the source magnetron assembly 320 can support a plasma for sputter deposition or sputter implantation of the substrate 105. This position may be referred to as a magnetron "out" position or first processing position.

Alternately, as illustrated in the top plan view of FIG. 3C, when the rotary shaft 193A rotates the cross arm 314 in the counter-clockwise direction $R_2$ about the rotation axis 194, the inertia and impeding forces cause the source magnetron assembly 320 to rotate in a clockwise direction about the pivot axis 319 until the bumper 317 (FIG. 3A), which is fixed to the source magnetron assembly 320 engages the other side of the cross arm 314. In this configuration, the source magnetron assembly 320 is disposed at its inward location away from the edge of the target 132 and closer to the rotation axis 194 so that the source magnetron assembly 320 can support a plasma near the center of the target to clean this region. This position may be referred to as a magnetron "in" position or second processing position.

In one embodiment, as noted above and illustrated in FIGS. 3A and 3D, the source magnetron assembly 320 is formed in a non-closed loop design to reduce the intensity of the plasma formed in the plasma region "P". In this configuration, the non-closed loop design is formed in an arc shape that has a radius D (FIGS. 3B and 3D), which extends from the arc center to the center of the gap 326. The arc may be sized and positioned so that the center of the radius D of the arc is coextensive with the center of the rotation axis 194 when it is disposed in the magnetron in a first processing position. In one embodiment, the formed arc has a radius D between about 7.3 inches (185 mm) and 8.3 inches (210 mm) and the target 132 has a diameter of about 17.8 inches (454 mm). In one embodiment, the arc is circular in shape and subtends an angle 341 (FIG. 3D) between about 70 and about 180 degrees, such as about 130 degrees. In one embodiment, the distance from the rotation axis 194 to the pivot axis 319 is equal to about the radius D of the arc.

In various embodiments, the outer pole 321 and inner pole 322 each comprise a plurality of magnets 323 that are positioned in an array pattern on either side of the gap 326 and are capped by a pole piece 329 (FIG. 3A). In one configuration, the north (N) poles of the magnets 323 in the outer pole 321 are positioned away from the rotation plate 313 and south (S) poles of the magnets 323 in the inner pole 322 are positioned away from the rotation plate 313. In some configurations, a magnetic yoke (not shown) is disposed between the magnets of the inner and outer poles and the rotation plate 313. In one example, the source magnetron assembly 320 comprises an outer pole 321 that has 18 magnets contained therein and an inner pole 322 that has 17 magnets contained therein. In one embodiment, the magnets 323 are each configured to create a magnetic field having a strength, at or near their tip, of between about 1.1 kGauss and about 2.3 kGauss.

Exemplary Process

The improved sputtering chamber as outlined above has been proved to be able to offer low temperature deposition of various metals and dielectrics with high film quality as compared to CVD and ALD systems. One exemplary process that can benefit from the improved sputtering chamber is carbon-based hardmask films used in 3D NAND flash memory applications. Carbon-based materials, such as amorphous hydrogenated carbon films (a-C:H), have been used as an etch hardmask for metals, dielectric materials, or poly-Si due to its chemical inertness, optical transparency, and good mechanical properties. However, carbon films with high concentration of hydrogen often show poor film structure and intrinsic film stress that may result in patterned line bending or line breakage during the subsequent etching process. Amorphous carbon films substantially consists only of carbon has shown great film hardness and excellent etching selectivity since the film contains a large proportion of diamond bonds ($sp^3$ bonds). A hydrogen-free amorphous carbon film can be formed using a PVD method. However, PVD deposited amorphous carbon films also suffer from large surface roughness and high compressive stress. It has been found that implantation of the hydrogen-free film with carbon ions using the improved sputtering chamber proposed above can significantly release film stress and erode surface roughness. The final film post implantation shows relaxed stress, smooth surface, and etch selectivity that is 3 time higher than current state of the art carbon-based hardmasks. An exemplary process will be discussed below using the processing chamber discussed above with respect to FIGS. 1A-1B to 3A-3D.

Figure 4:
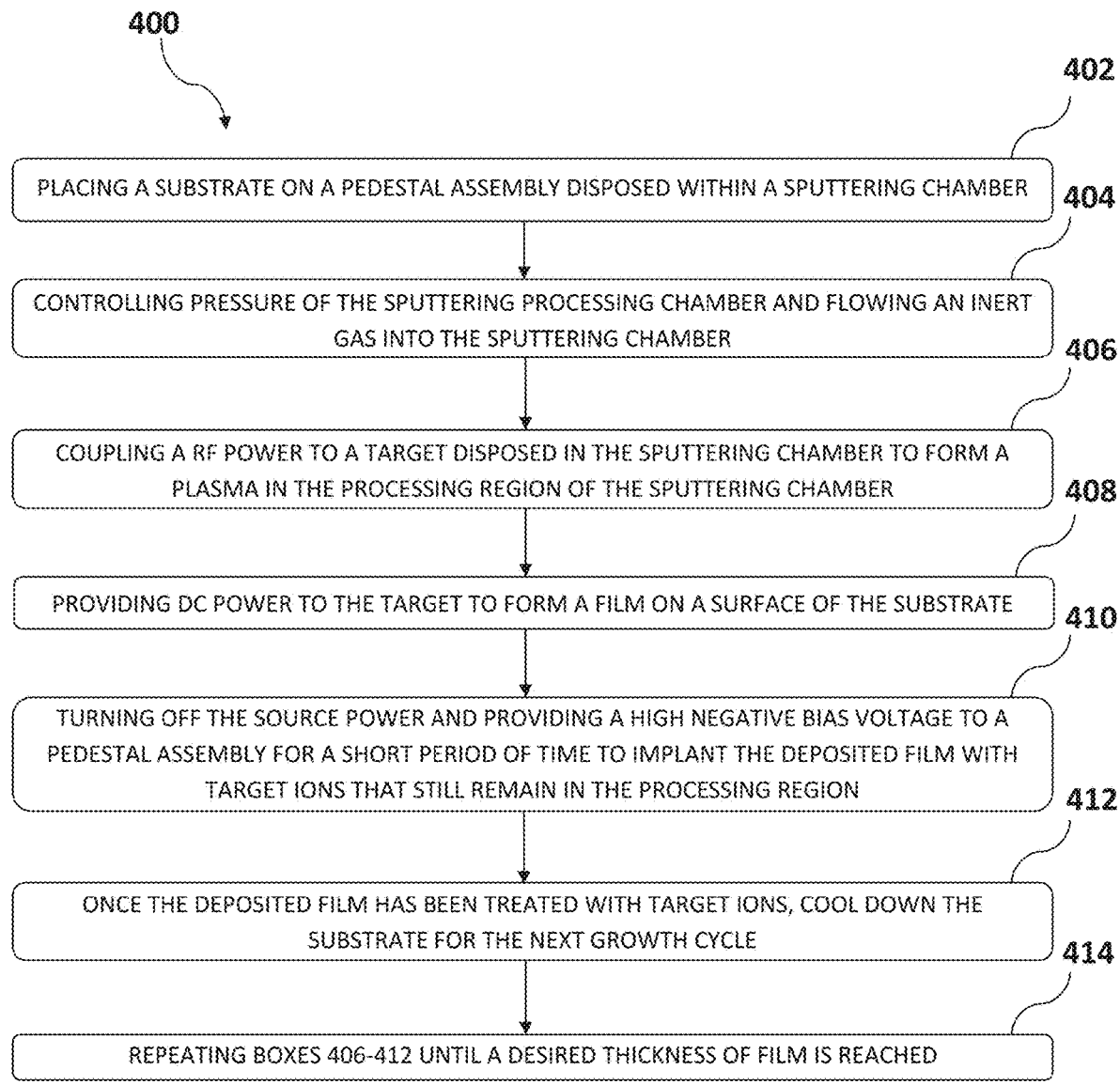
FIG. 4 is an exemplary process flow diagram for forming a carbon-based film according to embodiments of the present disclosure.

FIG. 4 is an exemplary process flow diagram for forming a carbon-based film according to embodiments of the present disclosure. FIGS. 5A-5C illustrate schematic cross-section views of a carbon-based film formed using the process flow diagram of FIG. 4. The process begins at box 402 by placing a substrate on a pedestal assembly 120 disposed within the processing chamber 100 depicted in FIG. 1. The substrate 502, as shown in FIG. 5A, may have a substantially planar surface. Alternatively, the substrate 502 may have patterned structures, a surface having trenches, holes, or vias formed therein. While the substrate 502 is illustrated as a single body, it is understood that the substrate 502 may comprise one or more metal layers, one or more dielectric materials, semiconductor material, and combinations thereof, depending upon application.

At box 404, the pressure of the processing chamber 100 is set to a sub-atmospheric level between about 0.6 mTorr to about 400 mTorr, for example about 5 mTorr to about 30 mTorr, using the vacuum pump 149 shown in FIG. 1. An inert gas, such as argon, is introduced into the processing region 110 via gas conduits 144 of the processing chamber. The flow rate of the inert gas varies as a function of the chamber size, ranging from about 30-300 sccm for a processing chamber with a processing region 110 that is 200 mm in diameter to 800-2000 sccm for a processing chamber with a processing region 110 that is 1300 mm×1500 mm in area. One skilled in the art can readily determine an appropriate flow rate and related process parameters discussed herein, depending on the size of the processing chamber.

At box 406, a plasma is formed in the processing region 110 of the processing chamber 100 by coupling a RF power (from the RF source 181) to the target 132 disposed in the processing chamber 100. In cases where a carbon film is desired, a carbon target or a carbon-containing target is used. The RF power may be supplied to the target 132 in a range of about 0 kW to about 10 kW, for example about 1 kW to about 5 kW, at a frequency of about 2 MHz to about 13.56 MHz.

At box 408, while the target 132 is electrically biased by the RF power, the DC source 182 is turned on to provide DC power to the target 132. DC power coupled to the target provides a higher sputtering ion energy to the argon ions in the processing region 110, resulting in strong bombardment of the carbon target surface to dislodge carbon atoms from the target 132. The sputtered carbon atoms travel toward and land on the surface of the substrate 502 to form a first layer of carbon film 504 thereon, as shown in FIG. 5A. During the sputtering process, the target 132 may be supplied with RF power in a range of about 0 kW to about 20 kW, for example about 1 kW to about 10 kW, at a frequency of 13.56 MHz, and DC power in a range of about 0 kW to about 10 kW, for example about 1 kW to about 5 kW. In one embodiment, an RF power density of about 1 kW/m$^2$ and a DC power density of about 5 kW/m$^2$ are coupled to the target. The sputtering process may be performed for a period of time, for example about 0.1 seconds to about 120 seconds, which may vary depending on the desired thickness of the carbon film.

The source power, i.e., the RF power and the DC power, may be provided in a constant or pulsed manner. In some embodiments, the RF power may be provided in a constant manner while the DC power may be provided in a pulsed manner, or vice versa. In some embodiments, the RF power and the DC power are operated in a pulsed manner (pulsed RF-DC operation). The pulsed RF-DC operation, as discussed previously, may include a regular pulsed mode and a high frequency pulsed mode controlled by the pulse controller 173 shown in FIG. 1. If the regular pulsed mode is desired, each RF/DC pulse provided to the target 132 may have a pulse duration of about 300 microseconds to about 800 microseconds, for example about 350 microseconds to about 650 microseconds. Each RF/DC pulse provided to the target 132 can have a pulse repetition frequency ranging from about 1 Hz to about 200 Hz, such as about 5 Hz to about 100 Hz. The RF power and the DC power may be provided at a duty cycle of 50% to 90%. If the high frequency pulsed mode is desired, each RF/DC pulse provided to the target 132 may have a duration of about 100 microseconds to about 300 microseconds, for example about 150 microseconds to about 250 microseconds. Each RF/DC pulse provided to the target 132 can have a pulse repetition frequency ranging from about 200 Hz to about 20 KHz, for example about 300 Hz to about 600 Hz. The RF power and the DC power may be provided at a duty cycle of 1% to 10%. The pulse duration or repetition frequency may be tuned to achieve designated film thickness and growth rate. In either mode, the RF source 181 and the DC source 182 may be pulsed synchronously or asynchronously. It is believed that high frequency pulsed mode helps to breakdown target chemical bonds and creates plasma with large fraction of target material ion species.

During sputtering process, the magnetron system 189 shown in FIG. 1 may be translated relative to the target 132 so that the magnetron system 189 is positioned in a first processing position, such as depicted in FIG. 3D. Alternatively, the magnetron system 189 may be translated by rotating the magnetron system 189 about the center point of the target to any desired processing position illustrated in FIGS. 3B-3C. The magnetron system includes an outer pole 321 comprising a plurality of magnets 323 and an inner pole 322 comprising a plurality of magnets 323, wherein the outer and inner poles form an open-loop magnetron assembly. As discussed previously, the use of an open loop magnetron configuration provides improved material composition uniformity across the substrate surface, when used in conjunction with high pressure, RF and DC sputtering of the target. Alternatively, in some embodiments the outer and inner poles may form a close loop magnetron configuration.

At box 410, once the first layer of carbon film has deposited on the surface of the substrate 502, both RF source 181 and DC source 182 are turned off. A high negative bias voltage is then provided (by the bias power source 141) to the pedestal assembly 120 of FIG. 1 for a short period of time to implant the deposited carbon film with carbon ions 506 that still remain in the processing region 110, as shown in FIG. 5B. The negative bias voltage may be between about 1 kW and about 30 kW, for example about 5 kW to about 10 kW. The kinetic energy of the carbon ions collided to the substrate will be greater with such high negative bias voltage, and the treated carbon film will have low density due to an amorphous and coarse texture. In addition, when high bias voltage is used, the substrate temperature rises due to high-energy carbon ion irradiation. As a result, the residual stress in the deposited carbon film is moderated. FIG. 5C shows the treated carbon film with relaxed film stress and smooth surface roughness.

The high negative bias voltage may be applied to the pedestal assembly 120 in a constant manner. In some embodiments, the high negative bias voltage is applied to the pedestal assembly 120 in a regular pulsed mode or a high frequency pulsed mode as discussed previously. If the regular pulsed mode is desired, the high negative bias voltage may have a pulse duration of about 100 microseconds to about 200 microseconds and a pulse repetition frequency of about 1 Hz to about 200 Hz, for example about 50 Hz to about 100 Hz. The high negative bias voltage may be provided at a duty cycle of 1% to 10%. If the high frequency pulsed mode is desired, the high negative bias voltage may have a pulse duration of about 100 microseconds to about 300 microseconds and a pulse repetition frequency of about 200 Hz to about 20 KHz, for example about 300 Hz to about 600 Hz. The high negative bias voltage may be provided at a duty cycle of 1% to 20%. The pulse duration or repetition frequency may be tuned to achieve designated film thickness and growth rate. In one embodiment where a high frequency pulsed mode is adapted, the bias voltage and the source power are synchronized such that high density of target ion species exited by high frequency pulse source are deposited and implanted on the substrate surface. As a result, a higher deposition rate is achieved.

Figure 6C:
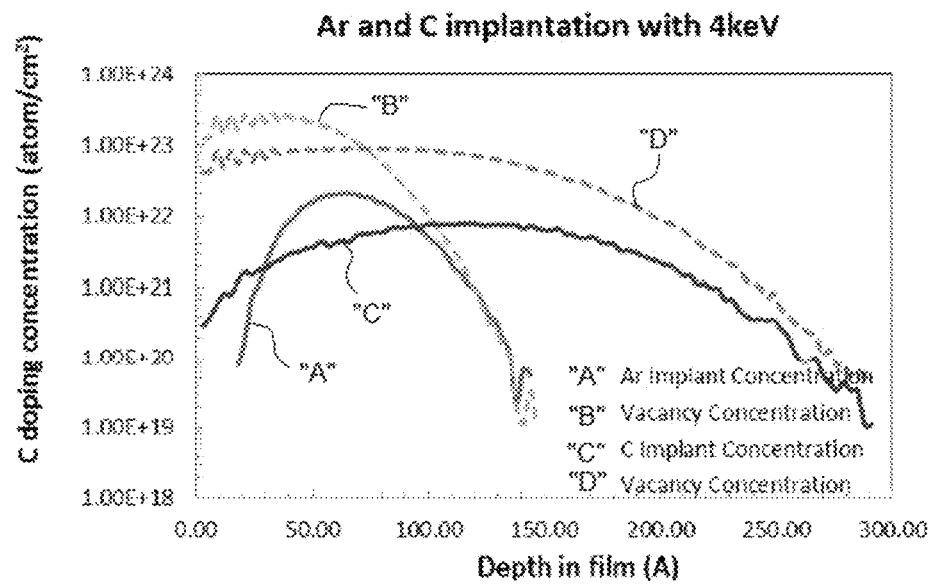
FIG. 6C is a graph of simulation data of ion species implantation profile according to embodiments of the present disclosure.

FIGS. 6A and 6B show the relationship between the bias voltage and implantation characteristics using the processing chamber of FIG. 1. Specifically, FIG. 6A illustrates a graph of DC voltage and dosage as a function of the bias power according to embodiments of the present disclosure. FIG. 6B illustrates a graph of sputter rate as a function of bias power according to embodiments of the present disclosure. As can be seen, the implantation dosage and sputtering rate both increase when the bias power is raised. This is because the high negative bias power affects the energy of the ions that strike the substrate surface as well as the doping level. FIG. 6C shows a graph of simulation data of ion species implantation profile according to embodiments of the present disclosure. Particularly, FIG. 6C illustrates characterization of doped argon and carbon ions trace in a targeting film by simulation and secondary ion mass spectrometry (SIMS) analysis. With all these information, a skilled artisan in the art can tailor or control designated implantation energy based on DC bias voltage monitoring, and control, calculate total dosage, and modulate sputter rate by controlling bias, source power, pressure and pulse duration as discussed in this disclosure to perform deposition-implantation cycle.

Figure 7A:
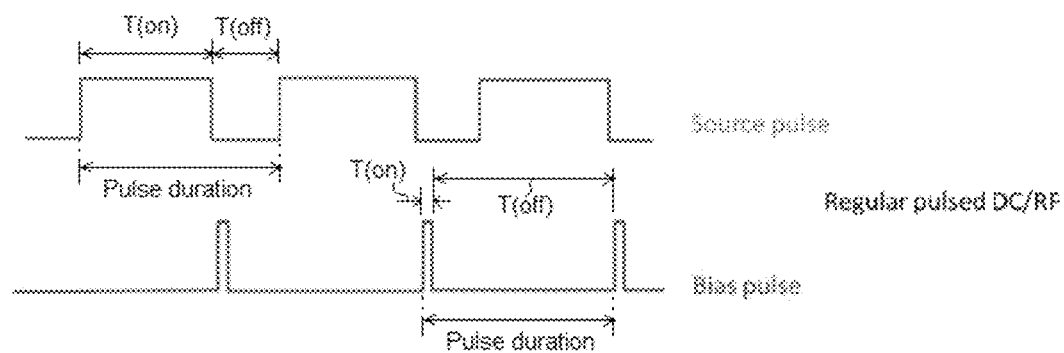
FIGS. 7A and 7B are schematics of duty cycle and pulse variation for regular pulsed mode and high frequency pulsed mode, respectively, according to embodiments of the present disclosure.
Figure 7B:
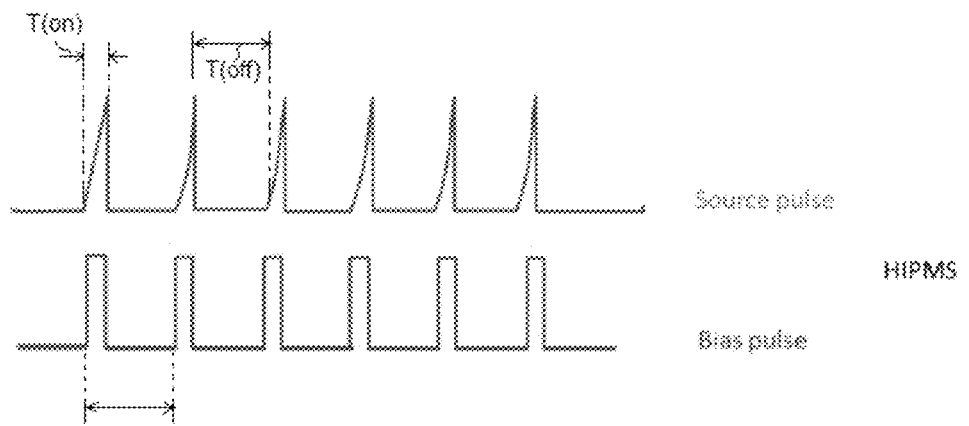

FIGS. 7A and 7B are schematics of duty cycle and pulse variation for regular pulsed mode and high frequency pulsed mode, respectively, that may be applied to various embodiments of the present disclosure. As can be seen in FIG. 7A, the pulsing and duty cycle of the source power (i.e., the RF power and the DC power) and the bias voltage may be controlled for cyclic deposition and treatment process, where the bias voltage is turned on "T(on)" during source power off "T(off)" cycle and using the radicals left from the source plasma for implantation of ions. FIG. 7B shows that the bias voltage and the source power are synchronized in order to increase the deposition rate.

At box 412, once the deposited carbon film has been treated with carbon ions, the substrate 502 is cool down for the next growth cycle.

At box 414, the process described at boxes 406-412 is repeated until a desired thickness of carbon film is reached. FIGS. 5D-5I schematically show another two growth cycles in which a second layer of carbon film 510 and a third layer of carbon film 512 are sequentially formed over the first layer of carbon film 504 and treated with carbon ions. Although three layers of carbon film are illustrated, embodiments of the present disclosure are not limited to a particular number of layers.

While the description above primarily discusses the processes of carbon film formation, the concept is not intended to be limiting as to the scope of the disclosure described herein. Embodiments of the present disclosure provide the ability to deposit metals, which may include, but are not limited to scandium (Sc), yttrium (Y), zirconium (Zr), lanthanum (La), cerium (Ce), praseodymium (Pr), neodymium (Nd), samarium (Sm), europium (Eu), gadolinium (Gd), terbium (Th), dysprosium (Dy), holmium (Ho), erbium (Er), thulium (Tm), ytterbium (Yb), lutetium (Lu), and hafnium (Hf). Other materials such as aluminum, copper, nickel, platinum, silver, chrome, gold, molybdenum, silicon, ruthenium, tantalum, tantalum nitride, tantalum carbide, titanium nitride, tungsten, tungsten nitride, alumina, lanthanum oxides, nickel platinum alloys, and titanium, and or combination thereof, may also benefit from the present disclosure.

In summary, embodiments of the present disclosure enable a sputtering chamber to provide in-situ ion implantation capability by coupling a high bias voltage (e.g., 1 kW or above) to a pedestal assembly. The pedestal assembly has a flat substrate receiving surface and is fabricated by a bulk ceramic without having gas conduits or grooves formed in the substrate receiving surface that would easily cause arcing at high power. The sputtering chamber utilizes RF-DC power sources coupling to a target to provide strong bombardment of the target with minimized plasma related damage of the substrate. The addition of RF power to the target also increases the ionization of the plasma which helps improve the affects of substrate bias on the depositing ions. An optical emission spectrometer is disposed inside the sputtering chamber to work with a probe equipped in the pedestal assembly to simultaneously or nearly simultaneously measure and/or control implantation bias voltage and dosage for accurate dosing control. The sputtering chamber also provides side gas injection and an exhaust assembly having a pumping port disposed concentric with the sputtering chamber. The symmetrical positioning of the pumping port provides improved gas flow symmetry within the sputtering chamber to allow more uniform gas flow over the substrate surface and promote uniform plasma formation. These unique chamber designs in combination allow low temperature deposition of multiple materials from metal to dielectric with high film quality as compared to conventional PVD, CVD or ALD systems.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber for processing a substrate, comprising:
    a target having a first surface disposed in a processing region of the processing chamber and a second surface that is opposite the first surface;
    an RF power supply configured to generate a plasma, the RF power supply coupled to the target;
    a DC power supply coupled to the target;
    a substrate support comprising a support body, the support body having an electrode embedded therein, and a substrate receiving surface across an entire diameter of the substrate support, the DC power supply configured to energize ions from the target for forming a film layer on a surface of the substrate;
    a bias power source coupled to the substrate support;
    a pulse controller coupled to the bias power source, the pulse controller configured to apply a pulse control signal to the bias power source such that bias power is delivered either in a regular pulsed mode having a pulse duration of about 100 microseconds to about 200 microseconds and a pulse repetition frequency of about 1 Hz to about 200 Hz, and a high frequency pulsed mode having a pulse duration of about 100 microseconds to about 300 microseconds and a pulse repetition frequency of about 200 Hz to about 20 KHz, wherein the bias power source is configured to implant ions into the substrate;
    a probe coupled to the electrode and bias power source, the probe configured collect data for estimating an ion dose rate, the bias power source electrically coupled between the probe and the pulse controller; and
    an exhaust assembly having a concentric pumping port formed through a bottom of the processing chamber.

2. The processing chamber of claim 1, further comprising:
    a rotatable magnetron disposed adjacent to the second surface of the target.

3. The processing chamber of claim 1, wherein the RF power supply and the DC power supply are configured to operate at a pulse duration of about 300 microseconds to about 800 microseconds and a pulse repetition frequency of about 1 Hz to about 200 Hz.

4. The processing chamber of claim 3, wherein the RF power supply and the DC power supply are configured to operate at a duty cycle of 50% to 90%.

5. The processing chamber of claim 1, wherein the RF power supply and the DC power supply are configured to operate at a pulse duration of about 100 microseconds to about 300 microseconds and a pulse repetition frequency of about 200 Hz to about 20 KHz.

6. The processing chamber of claim 5, wherein the RF power supply and the DC power supply are configured to operate at a duty cycle of 1% to 10%.

7. The processing chamber of claim 1, wherein the bias power source is configured to provide a negative bias voltage of about 1 kW to about 25 kW.

8. The processing chamber of claim 7, wherein the bias power source is configured to operate in a regular pulsed mode running at a duty cycle of 1% to 10%.

9. The processing chamber of claim 7, wherein the bias power source is configured to operate in a high frequency pulsed mode running at a duty cycle of 1% to 20%.

10. The processing chamber of claim 1, wherein the support body is an electrostatic chuck, a ceramic body, an aluminum body, a heater, a chiller, or any combination thereof.

11. The processing chamber of claim 1, wherein the substrate support is mounted cantilevered from a sidewall of the processing chamber.

12. A plasma processing chamber, comprising:
   a sputtering target;
   a rotating magnetron disposed adjacent to a surface of the sputtering target;
   an RF power supply configured to generate a plasma, the RF power supply coupled to the sputtering target;
   a DC power supply coupled to the sputtering target;
   a support body configured to support a substrate, the support body comprising an electrode embedded therein, and a substrate receiving surface, wherein at least a portion immediately below the substrate receiving surface has a uniform thickness across a diameter of the substrate receiving surface, the DC power supply configured to energize ions from the sputtering target for forming a film layer on a surface of the substrate;
   a bias power source coupled to the support body;
   a pulse controller coupled to the bias power source, the pulse controller applying a pulse control signal to the bias power source such that bias power is delivered either in a regular pulsed mode having a pulse duration of about 100 microseconds to about 200 microseconds and a pulse repetition frequency of about 1 Hz to about 200 Hz, and a high frequency pulsed mode having a pulse duration of about 100 microseconds to about 300 microseconds and a pulse repetition frequency of about 200 Hz to about 20 KHz, wherein the bias power source is configured to implant ions into the substrate;
   a probe coupled to the electrode and bias power source, the probe configured collect data for estimating an ion dose rate, the bias power source electrically coupled between the probe and the pulse controller;
   a gas conduit disposed at a sidewall of the plasma processing chamber;
   a shield coupled to the sidewall of the plasma processing chamber, wherein the shield extends downwardly to at least partially confine a portion of a processing region; and
   an exhaust assembly having a pumping port formed through a bottom of the plasma processing chamber, wherein the pumping port is disposed symmetrically about a central axis passing through the center of the plasma processing chamber.

13. The plasma processing chamber of claim 12, wherein the RF power supply and the DC power supply are configured to operate synchronized with the bias power source.

14. The plasma processing chamber of claim 12, wherein the RF power supply and the DC power supply are configured to operate asynchronously from the bias power source.

15. The plasma processing chamber of claim 12, wherein the RF power supply and the DC power supply are configured to operate at a duty cycle of 50% to 90%.

16. The plasma processing chamber of claim 12, wherein the RF power supply and the DC power supply are configured to operate at a duty cycle of 1% to 10%.

17. The plasma processing chamber of claim 12, wherein the bias power source is configured to provide a negative bias voltage of about 1 kW to about 25 kW.

* * * * *